United States Patent [19]

Sullivan

[11] 4,424,089
[45] Jan. 3, 1984

[54] PHOTOPRINTING PROCESS AND APPARATUS FOR EXPOSING PASTE-CONSISTENCY PHOTOPOLYMERS

[76] Inventor: Donald F. Sullivan, 115 Cambridge Road, King of Prussia, Pa. 19406

[21] Appl. No.: 313,609

[22] Filed: Oct. 21, 1981

Related U.S. Application Data

[62] Division of Ser. No. 147,726, May 8, 1980.

[51] Int. Cl.³ .................... B32B 31/06; B32B 31/12; G03G 5/05
[52] U.S. Cl. .................... 156/155; 156/242; 156/247; 156/273.5; 156/275.5; 156/277; 156/289; 156/344; 156/498; 355/132; 427/43.1; 430/270
[58] Field of Search .............. 156/247, 273.5, 275.5, 156/295, 498, 155, 242, 277, 289, 344; 430/270; 355/100, 132; 427/43.1, 54.1

[56] References Cited

U.S. PATENT DOCUMENTS

| | | | |
|---|---|---|---|
| 3,658,620 | 4/1972 | Hall | 156/275.5 |
| 3,837,887 | 9/1974 | Akamatsu et al. | 430/270 |
| 3,948,657 | 4/1976 | Yoshikawa et al. | 156/247 |
| 4,070,110 | 1/1978 | Ott | 355/100 |
| 4,087,182 | 5/1978 | Alba et al. | 430/306 |

*Primary Examiner*—Michael G. Wityshyn
*Attorney, Agent, or Firm*—Laurence R. Brown

[57] ABSTRACT

Paste-consistency photopolymer is imaged onto printed wiring boards by coating the board overall and positioning the photographic film over the board in register and off-contact. A resilient blade is pressed against the phototool at one end of the board and drawn across the surface, thus facing the photographic film into intimate contact with the photopolymer and purging all air therebetween. Mounted on the resilient blade aft of leading edge is a shuttered tubular lamp which hardens the photopolymer where the photographic film is clear, so that in a single pass the photographic film is sequentially mated and photopolymer exposed, to produce line widths unmatched by competing dry film systems and at speeds of 0.5 feet per second.

11 Claims, 4 Drawing Figures

PHOTOPRINTING PROCESS AND APPARATUS FOR EXPOSING PASTE-CONSISTENCY PHOTOPOLYMERS

This application is a division of application Ser. No. 147,726 filed May 8, 1980.

TECHNICAL FIELD

This invention relates to a photoimaging process and apparatus for producing images of high fidelity on substrates, particularly the formation of conductor patterns on printed wiring boards, graphic images on meter faces, precision four-color half-tone graphics, and the like, from paste-consistency photopolymers.

BACKGROUND ART

This disclosure teaches a new process and apparatus for producing graphic images on substrates, using photopolymers such as paste-consistency ultraviolet light (UV) curable photopolymers. These photopolymers are characterized by their composition of 100 percent reactive polymers, which are transformed from a paste-consistency wet film to a dry coating by exposure to a strong UV light source for several seconds. The photopolymers as used in the disclosed process are further characterized as being imaging quality, or capable of being selectively hardened by light passing through a photographic master, thereby producing a film securely affixed to a substrate, at locations where the photographic master allows the UV light to impinge on the photopolymer.

The photopolymers which can be imaged by the disclosed process and apparatus are of known composition, a representative list being included herein. These photopolymers are available commercially as plating resists and as etch resists for use in printed wiring board (PWB) manufacture, for example. These photopolymers are also used extensively in graphics imaging and are being applied conventionally by screen printing.

This class of photopolymers has been developed to be applied to substrates via screen printing, wherein the images are deposited on the substrates as wet photopolymer, and are then hardened and transformed into permanent images by using subjected to a strong UV light source.

The screen printed photopolymer images are characterized by indistinct boundaries, loss of fidelity, smeared images and limited film thickness, not so much because of the photopolymer viscosity characteristics as the inherent limitations of screen printing art as achieved in a production environment by semi-skilled printers.

The images which can be achieved using the disclosed process and apparatus and the same photopolymers are characterized by lines having sharp, distinct boundaries, exceptional fidelity with film thicknesses up to 0.002 inches (0.5 mm) and no smearing. For example, screen printed PWB resist patterns are practically limited to conductor widths and spacing of 0.010 inches (2.54 mm) minimum, while the same photopolymers can be imaged as disclosed herein to produce line widths and spacings of 0.003 inches (0.076 mm), with a film thickness of 0.0025 inches (0.006 mm).

Screen printed half-tone images are limited to a practical upper range of 105 lines, with dot sizes of 20 to 80 percent. The same photopolymer imaged as described herein can produce half-tone graphics of 150 lines, with dot sizes of 5 to 95 percent.

In addition to improving on the quality of images produced by screen printing, the disclosed process and apparatus produces superior images as compared with images produced by the dry film photoresists such as in widespread use in the manufacture of printed wiring boards.

Dry film photoresists are laminated onto the PWB by heat and roller pressure; exposed to a UV light source through a photo image, hardening the exposed photopolymer to the extent that the subsequent solvent washout step ideally removes only unexposed photopolymer. The images produced are of excellent definition, having distinct boundaries uniform thickness and a resolution down to 0.005 inches (0.13 mm) line widths. Dry fulm photoresist images are expensive to produce owing to the cost of photopolymer, the necessity to discard twice as much plastic carrier film as applied photopolymer; and the need for expensive laminating, exposing and washout equipment.

In addition to screen printed images and dry film photoresist images, a third imaging method is known but not in widespread use, wherein PWB solder mask coatings are photoimaged by the Bell Laboratories. The process consists of roller coating the PWB surface with solder mask photopolymer, laminating a thin plastic sheet thereover and exposing the photopolymer through a phototool via a collimated light source. Use of atmospheric pressure to force the phototool into intimate contact with the thin plastic sheet would force or extrude the photopolymer into the drilled holes, and thins out the coating on the printed wiring. The thin plastic sheet also separates the emulsion of the phototool from that surface of the photopolymer so that loss of fidelity is experienced because of light undercutting.

While this invention is advantageous in making printed wiring boards (PWB), it also in the same manner produces high resolution half-tone or line printing plates, with very simple equipment which is readily automated as compared with prior art systems.

Exemplary prior art for preparation of photopolymer printing plates includes U.S. Pat. No. 4,070,110—J. W. Ott, Jan. 24, 1978 for producing photopolymer relief printing plates in a semi-automated process. Thus a sandwich array is prepared by laminating a cover film and backing sheet with intermediate photopolymer applied in liquid form and hardened by partial exposure to light. The sandwich is after being completely formed, flattened under pressure, while exposing through the phototransparencies. A complex machine array for a similar laminating and followthrough developing process is shown also in U.S. Pat. No. 4,087,182—H. Aiba et al., May 2, 1978. These are contact printing processes as compared with a photo imaging process such as described in U.S. Pat. No. 4,052,603—K. Karlson, Oct. 4, 1977.

All of these involve complex and expensive machinery and do not result in simple single pass lamination and exposure scanning as does the present invention.

Other methods of sandwiching and developing photopolymer plates have been devised such as set forth in U.S. Pat. No. 3,848,998—S. Yonekura et al., Nov. 19, 1974 using rigid plates.

However rigid plates cannot be used to achieve desired high resolution because of the difficulty at low expense to achieve optically flat surfaces and the dependency upon a uniform thickness and very smooth surface on the photopolymer being exposed.

Therefore the present invention has as a general object, the simplicity and improvement of prior art equipment and processes for producing printed elements of high resolution with photopolymers.

DISCLOSURE OF INVENTION

The objectives of this invention are to provide a new industrial process and apparatus which will significantly improve the art of image formation on substrates, in which a significant image thickness is required, through the use of photopolymers which are applied in the wet state and converted to a hardened polymerized state by exposure to light.

One objective is to provide a significant improvement in attained image resolution over known competing imaging processes.

A second objective is to specify materials and processes which will greatly reduce the waste of resources associated with dry film resists. For every square foot of dry film photopolymer applied to PWB surfaces, two square feet of polyester and polyolefin film are wasted. The disclosed technique wastes no film and no photopolymer.

Another objective is the use of apparatus and photopolymers which greatly reduce the total cost of image formation, by use of less expensive equipment, less expensive photopolymer and by increasing and productivity of personnel.

Another objective is to be able to image substrates which can presently be done only by screen printing because of substrate size or thickness, in which the inherent limitations of screened printing are overcome, including Moire patterns in half-tone images and limited resolution of line images.

This disclosure also teaches improved methods for processing the wet photopolymer coatings to achieve the precision images detailed herein.

One objective is to mate the photopolymer-coated phototool with the substrate so as to exclude air from the photopolymer.

Another objective is to speed up the normal exposure cycle of dry film photoresists consisting of vacuum drawdown then exposure. The disclosed apparatus mates one area of the PWB and phototool while a previously-mated area is being exposed, so that on a single scan the mating and exposure is accomplished without external vacuum source.

Another objective is to provide a way to coat a non-wetting surface, in such a way that the applied photopolymer does not develop fish-eyes or voids.

The process consists of the steps of preparing a phototool (or photomask) which describes the images to be reproduced, with clear areas of a non-stick material on the substrate-facing surface; the coating of the phototool with a thin layer of photopolymer; the partial polymerization of the photopolymer to prevent de-wetting on non-stick phototool areas; the placement of the phototool above and off-contact to the substrate being imaged; the mating of the phototool with the substrate so as to exclude all air by use of a resilient blade drawn across the topside of the phototool; the selective exposure of the photopolymer through the phototool by a tubular mercury vapor lamp which traverses the phototool just behind the resilient blade. Thus, in one pass, images are produced at a scan rate of one foot (0.3 M) per 2 seconds. Following exposure, the substrate is peeled away from the phototool and subjected to a solvent spray removing unhardened photopolymer, leaving the desired image securely affixed to the substrate.

The described process and disclosed apparatus enables images of exceptional resolution to be generated, using many available photopolymers, generally described as UV-curing photopolymers. These photopolymers are currently being applied by screen printing and cured by UV radiation, for imaging printed wiring boards, for printing meter faces, nameplates and screen-printed four color graphics. When these photopolymers are processed in accordance with this disclosure the images generated will faithfully reproduce phototool details, including lines having widths and separations of three-thousandths of an inch (0.076 mm). Further, images composed of half-tone dot patterns of 150 lines, from 5% to 95% can be faithfully reproduced.

The described processes and apparatus are capable of providing these images with a film thickness of 0.25 thousandth of an inch (0.006 mm), while film thickness of over 2 thousandths of an inch (0.05 mm) can be produced with some decrease in resolution.

BRIEF DESCRIPTION OF THE DRAWINGS

Further background, objects, advantages and features of the invention will be set forth throughout the following specification with reference to the accompanying specification with reference to the accompanying drawings wherein.

DESCRIPTION OF PREFERRED EMBODIMENTS

This detailed description begins with a technical description of the manufacturing requirements for PWB imaging, including image sharpness, resist uniformity in thickness; registration (accuracy of placement) and hole tenting. Also the light intensity requirements of the UV curable photopolymers to achieve polymerization is defined.

Next, this detailed description illustrates the techniques for mating the coated phototool with a cooper-clad printed wiring board; the near-simultaneous technique for curing; the selection of high temperature photo imaging means hereinafter termed a phototool, followed by the preferred embodiment for production printed wiring board imaging.

Throughout this disclosure the process of joining together the substrate, the photopolymer and the phototool into a unified assembly is referred to as mating.

IMAGING

Computer grade PC boards are typically manufactured in panel form in sizes of the order of 18 by 20 inches (0.46 M by 0.5 M). Conductor lines and spaces are of the order of 0.010 inches wide (0.025 cm) with sharply defined edges, free of nicks and bulges. Additionally, the imaging resist forming the conductors must maintain a constant thickness, consistent with the plating or etching chemicals, temperature and immersion time. Too thin a resist results in breakdowns and the plating of metal at unwanted locations.

With regard to image placement on the copper-clad board, the 18 by 20 inch (0.46 M by 0.5 M) panel will typically have an accuracy of 0.002 inches (0.05 mm) on drilled hole location, requiring that the imaging be accurate to within 0.005 inches (0.13 mm) in order to maintain an annular ring of the order of 0.005 inches (0.13 mm) around the hole.

CURING

As described earlier, the UV curable photopolymers used in PWB manufacture have been developed to be applied by screen printing over the copper surface and cured by conveying under 200 watt-per inch mercury vapor lamps at a speed of 12 feet (3.66 M) per minute. The surface temperature rise is significant, for the board receives approximately 200 watt-seconds of energy per square inch of area. Typically, surface temperatures in excess of 300 degrees F are experienced. The aforementioned 200 watt-seconds per square inch (6.45 cm²) energy requirement is for photopolymer whose surface is exposed to air. Most all of the tested photopolymers are affected by air to the extent that the exposure energy can be reduced to only 50 watt-seconds per square inch (6.45 square cm) when the air is completely excluded by the mating process described herein.

PHOTOTOOL MATING

A phototool, as used herein, is a transparent sheet with light opaque areas corresponding to the image to be reproduced, and this phototool is placed between the UV lamp and the substrate to control those areas of photopolymer to be hardened. The terms phot image, photomask and phototool can be used interchangeably.

While it is possible to image the coated PWB with the phototool off-contact, it is not cost-effective, since an expensive collimated light source is required; other light sources will produce light undercutting, reduced line widths, and loss of line fidelity.

In order to use a non-collimated light source and still achieve fine line imaging, it is necessary for the phototool to intimately contact the photopolymer, as is accomplished herein.

Figure 1:
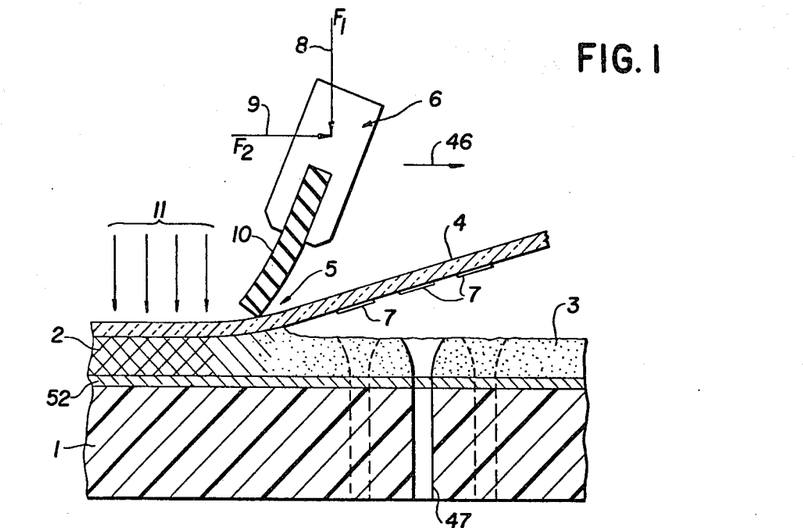
FIG. 1 is a dragrammatic side view sketch, partly sectioned to illustrate the mating of a photo image with a coated substrate by use of a resilient blade as provided by this invention.

FIG. 1 shows a section of a PWB 1 in which the phototool is being mated to the coated surface 3. PWB 1 has been previously roughly coated with photopolymer layer 3. Phototool 4 is positioned above and off contact with PWB 1 with opaque areas 7 registered to drilled holes 47 in the PWB 1. Assembly 6 movable in the direction of arrow 46 has rubber blade 10 of 50 durometer, which traverses the top surface of phototool 4. Force $F_1$ in direction 8 on phototool 4 causes the phototool to contact the photopolymer and force $F_2$ in the direction of movement 9 causes blade 10 to traverse the topside of the phototool and progressively mate the phototool with the photopolymer.

This technique purges the photopolymer of air bubbles which may have been entrapped during the coating cycle, and also prevents the entrapment of air resident between the phototool and photopolymer surface.

This mating technique has several highly desirable features not readily obtainable otherwise. First, the photopolymer surface, when coated, may be mottled or have an orange-peel effect. These surface irregularities are smoothed out and the mated surface conforms to the smooth plastic surface topology of phototool 4 as well as the substrate. In the case of a PWB the substrate carries a copper layer 52 surface which is to be conformed to the image of the phototool 4, for example. This is illustrated in FIG. 1 with crosshatched photopolymer area 2 being in surface to surface contact because of the previous scanning of surface contact member 10, preferably a rubber blade, across the phototool 4 surface.

While this mating technique smoothes out surface irregularities, there is no tendency for the photopolymer to be forced out ahead of the blade and thereby reduce the coating thickness.

At the point 5 where the blade edge contacts the phototool, the instantaneous pressure may reach 300 pounds per square inch (2067 kPa). This high pressure causes any trapped air bubbles to burst and the air is forced out ahead of the blade.

Experiments with the substitution of a rubber roller in the manner of U.S. Pat. No. 3,837,887—K. Akamatsu et al., Sept. 24, 1974 in lieu of the blade yielded inferior results, for air was entrapped under the phototool.

On those areas of the phototool now mated with the (crosshatched) photopolymer, a strong holding force is maintained between the phototool and PWB surface. Thus, atmospheric pressure 11 (FIG. 1) maintains the phototool in intimate contact with the photopolymer surface indefinitely, without an outside vacuum source. Phototool opaque areas 7 (which usually do not constitute surface irregularities) are in intimate contact with the photopolymer surface, and the photopolymer can be exposed with a non-collimated light source and produce high fidelity reproduction of images on the phototool on the PWB plating resist pattern.

Figure 2:
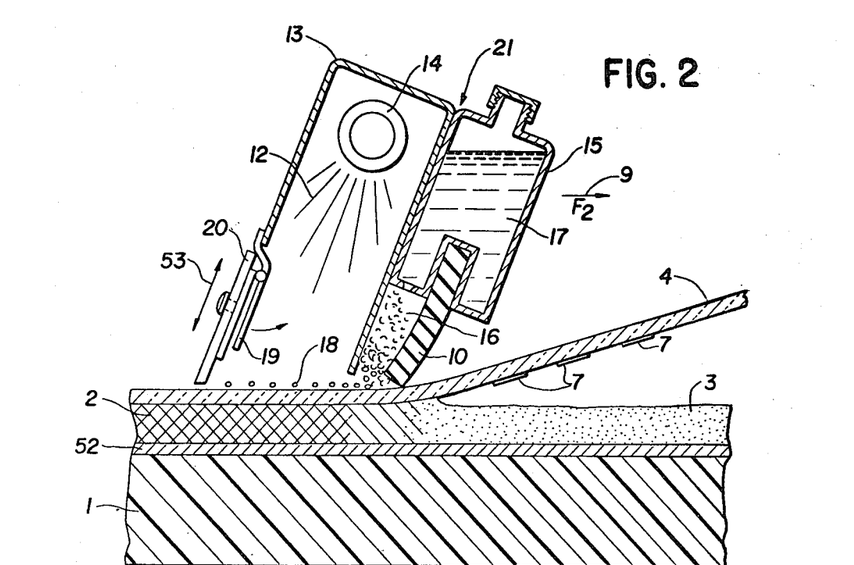
FIG. 2 is a further similar sketch illustrating the mating during an exposure step wherein a coolant dispenser and tubular lamp are co-mounted to protect the photo image from excess heat and expose the photopolymer all on one scan.

FIG. 2 shows a preferred method for curing photopolymer 3. For this purpose, UV lamp 14 and reflector-focuser 13 are mounted on the same movable transversing assembly 21 as blade 10. After the blade causes the phototool to mate with the photopolymer, light rays 12 expose and polymerize the photopolymer layer 2 directly beneath the phototool transparent areas. Light rays 12 cannot expose those areas ahead of blade 10.

FIG. 2 shows the coolant dispensing apparatus; reservoir 15, supplying coolant 17 to sponge 16 and thence to phototool 4 in a film shown as droplets 18. Shuttering is accomplished automatically by pivoted shutter 19 as the assembly 21 is lowered into contact with phototool 4. Light shroud 20 contacts phototool 4 and slides upward along the reflector-focuser 13, and actuates the pivoting shutter 19 which opens to expose the mated photopolymer. Arrow 53 shows the reciprocal movement of the transversing assembly to move from rest into engagement on transversal and then back into a spaced separation position from the photopolymer layer 3.

FIG. 2 shows 3 distinct zones or conditions of photopolymer. Photopolymer 2 under lamp 14 is polymerized as shown by crosshatching, while photopolymer 2 under sponge 16 is under vacuum but not yet exposed as indicated by lining; photopolymer 3 is not yet contacted by phototool 4 and is therefore at atmospheric pressure as indicated by dotting. This progressive exposure method is an advancement in the art of producing printed plates with photopolymers, since present systems require a time of several seconds for drawdown of the entire phototool before the exposure begins as for example in the aformentioned U.S. Pat. No. 4,070,110. Similarly vacuum drawdown techniques are costly and time consuming. Since the disclosed system requires no external vacuum and exposes during scanning, this drawdown period and equipment is eliminated.

The following sections describe the preferred phototool construction techniques to image the major photopolymer resists in use in PWB manufacture and photopolymers used in graphics imaging.

PHOTORESISTS

Representative photoresists and manufacturers are listed below:

| Manufacturer | Product Code | Description |
|---|---|---|
| W. R. Grace Corp. Columbia, Md. | SPR 7263 LR SPR 7263 M | Plating Resist Etch Resist |
| Dynachem Corp. Tustin, Calif. | SR 30 H | Screen Resist |
| Mac Dermid Corp. Waterbury, Conn. | 9403 | UV Plating Resist |
| Colonial Printing Ink E. Rutherford, N.J. | UV 50-48 | Solder Mask |
| Advance Processing & Supply Corp. Chicago, Ill. | UVAL | Graphics Imaging UV Curable Photopolymer |

These photoresists have been developed to be screen printed to a thickness of 1 to 2 thousandths of an inch (0.025 mm to 0.05 mm), and cured by a two-lamp assembly, each lamp rated at 200 watts per linear inch (2.54 cm), with a conveyor speed of 12 feet per minute. With the disclosed equipment the phototool is placed between the lamp and PWB, subjecting the phototool to temperature ranging up to 300 degrees F. While the phototool temperature can be reduced to less than 100 degrees F. by utilizing a different lamp source and increasing the exposure time to the order of 40 seconds, the preferred embodiment is the use of polyester sheet and a high temperature silicone rubber layer to bond the opaque areas 7 (FIG. 1) to the sheet 4; and the use of a liquid coolant on the surface of the sheet.

PHOTOTOOL

Referring to FIG. 1, phototool 4 is seen to be subjected to a horizontal force 9 which tends to stretch the phototool and thereby introduce registration errors. Polyester sheet in the thickness of 4 to 8 thousandths of an inch (0.1 to 0.2 mm) provides the stability needed by the phototool, plus the ability to withstand short temperature excursions to 250 degrees F. Phototool opaque areas consist of etched metal foil, preferably aluminum.

To make a phototool, a sheet of clear polyester and a thin sheet of aluminum foil are laminated together, with a thin layer of clear silicone rubber adhesive bonding the two securely. The foil is given a pre-etch in sodium hydroxide in order to reduce the foil thickness to the order of 0.0001 inch (0.0025 mm). The foil is then coated with a photographic etch resist, exposed, washed out and then etched again to produce the phototool image in etched foil.

Etched aluminum foil is preferred over other black emulsion systems since a large area of black emulsion would absorb large quantities of heat which could distort the phototool, while the aluminum surface reflects heat and reduces the total amount absorbed.

For use in this invention the phototool is previously coated and imaged for subsequent use in imaging substrates. The aformentioned polyester sheet 4 with bonded foil is stretched in phototool frame 24, FIG. 3, coated and inserted into the apparatus of FIG. 4. Exact registration between the phototool pattern and substrates to be imaged in production is achieved by placing a production substrate onto the substrate mounting plate 22 in register such as by use of registration pins 27. Next the master artwork is placed in frame 24 over the substrate in exact register. The mounting plate is secured to the phototool frame as in FIG. 3 in register by means of hinge 23. The resilient blade 10 is drawn across the polyester sheet 4 which was previously developed from an artwork master and photopolymer coated polyester sheet, thereby transferring the artwork in the form of a foil surface 7.

Figure 4:
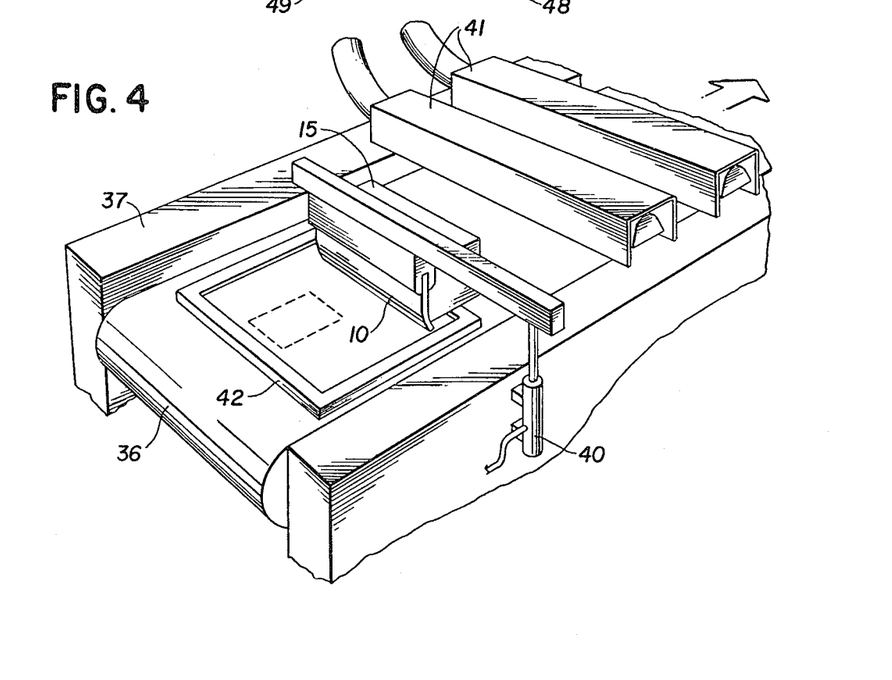
FIG. 4 is a perspective fragmental view of a simple unit for laminating and exposing a photopolymer containing sandwich array in accordance with the invention.

The flexible polyester sheet phototool 4 is coated over the foil surface with silicone rubber adhesive, Dow Corning product code 734 RTV, which serves two major functions. First, the resilient rubber can accommodate small dirt particles on the PWB surface. During the mating cycle PWB surface irregularities can cause a separation to exist between phototool and PWB surface which will mar the image over a much wider area than the irregularity itself. The silicone rubber, being resilient, conforms to the irregularity and reduces the marred area. Secondly, the silicone rubber adhesive forms a non-stick surface on the phototool to which hardened photopolymer will not adhere.

While a silicone rubber adhesive is the preferred bonding material for the foil coating, other materials can be used. Polyethelene was used in tests conducted by the applicant, with good results. Polyethelene provides a non-stick surface and has the added advantage of providing a surface which does not dewet when coated with photopolymer. However, polyethelene is thermoplastic and if subjected to temperatures of 250 degrees F. can melt and react with the photopolymer and thereby damage the phototool.

The phototool can also be made from polyester photographic film having either a silver halide emulsion or a diazo emulsion, with a suitable non-stick surface added. The aformentioned heat build up in large opaque areas may distort and damage this type of phototool.

Thus far in this disclosure, the use of a flexible phototool has been described. The phototool need not be flexible in all cases. For example, when imaging flexible printed wiring circuits, the phototool may be a glass plate and the flexible substrate mated with the phototool by drawing the blade across the flexible substrate. Thus, in the frame of FIG. 3, simply the substrate and phototool are interchanged in position. The photo scanning need then occur on the opposite side.

PHOTOTOOL COOLING

Depending on exposure time and distance of phototool from UV lamps, the temperature rise of the phototool can be up to 300 degrees F. and beyond. There are two practical techniques for reducing substrate temperature rise in conventional UV lamp conveyorized systems. First, the UV lamp can be water-jacketed to reduce convected thermal transfers and non-functional infra-red radiations. However, the cooling water must be distilled and exceptionally free of minerals and other impurities, which could reduce light output. The cost of piping and a stainless-steel heat exchanger is prohibitive.

A second technique for substrate cooling is to force cold air, at 30 degrees F. onto the substrate while under the UV lamp. This cooling technique is expensive and wasteful of energy.

A water spray on printed substrates to prevent overheating presents the hazard of water impinging on the hot lamp surface and causing catastrophic damage.

This disclosure teaches a way of introducing a liquid coolant onto the phototool surface at the trailing edge of the mating blade. A 50 percent water-alcohol solution is applied across the width of the phototool by a sponge. While many liquids can be used, it is necessary that the phototool be wetted completely and beading of coolant prevented. The coolant absorbs heat from the phototool by evaporation, yet does not significantly reduce the transmittance of the UV light energy. The alcohol-water solution will keep the phototool temperature to 200 degrees F. or lower.

As shown in FIG. 2, reservoir 15 contains the coolant solution, which is applied to phototool 4 by sponge 16. When two successive lamps are used, coolant film shown as droplets 18 is partially evaporated by the first lamp 14, and remain in diminished quantity to provide phototool cooling when passing under the second UV lamp.

Coolant solution is introduced after the mating blade, as the solution would be forced ahead of the blade if introduced there.

LIGHT SOURCE

In FIG. 2, UV light source 14 is a commercially available medium pressure mercury vapor lamp, whose length is chosen to correspond to the width of the substrate to be imaged. One suitable lamp is manufactured by Canrad-Hanovia Company of Newark, N.J. The lamp is mounted in irridator 13, FIG. 2, which is manufactured by the same company.

Figure 3:
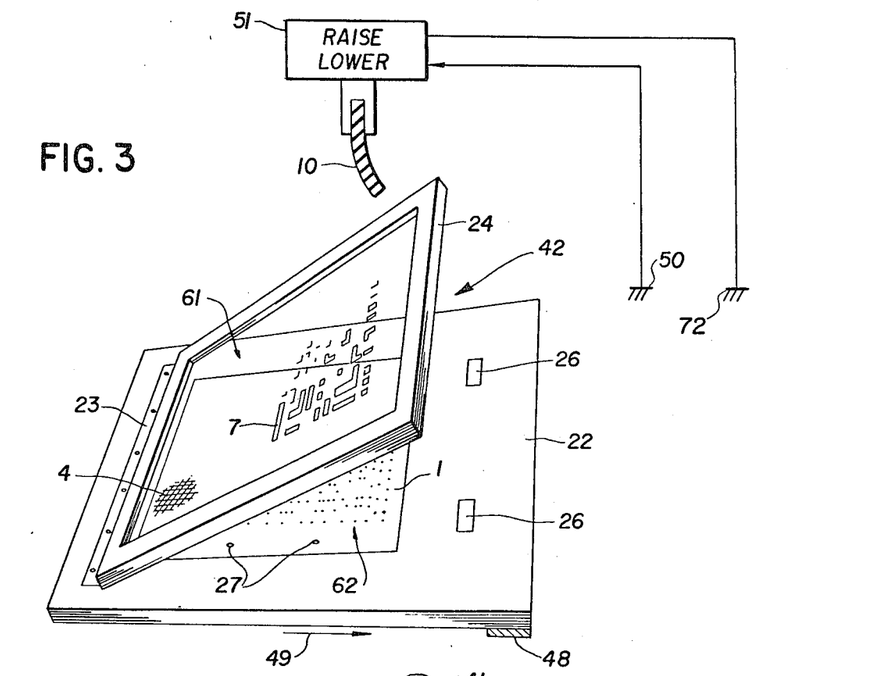
FIG. 3 is a perspective sketch of a fixture for mounting the photo image and the substrate in register prior to being mated together with schematic control features.

FIG. 3 shows a fixture for mounting the phototool and PWB in register and off contact.

The fixture shown in FIG. 3 is used when precise registration is required, when a conveyorized UV curing unit is used as the exposure source, or when a pre-registered fixture is needed, but the process of FIG. 2 can be carried out by hand without the needs of a fixture.

In the fixture 42, PWB 1 mounts on base 22 and is registered via pins 27. Phototool 4 is mounted on frame 24 which maintains the phototool in registration with drilled PWB 1. Hinge 23 allows frame 24 to be raised and lowered for placement and removal of PWB 1. Spacers 26 maintain off-contact distance between phototool 4 and PWB 1 top surface.

In FIG. 3, mounting base 22 has a metal strip 48 affixed to the under side, whose purpose is to cause the generation of an electrical signal when the exposure assembly is conveyed in direction 49 past a sensor 50 serving to actuate a lowering mechanism at control center 51 for positioning the mating blade 10. A similar electrical signal at 72 will in turn cause the mating blade to rise. Thus contact of the phototool at the leading edge of the image area with the blade 10 is automated. Also the signal at sensor 72 will also cause the blade to be raised automatically at the trailing edge of the image area.

IMAGING SEQUENCE

The following chart shows the process steps of this invention to be followed where hole tenting is not required.
a. prepare phototool and install in the fixture.
b. coat the drilled PWB with paste photopolymer.
c. install PWB in registation on the fixture.
d. mate the phototool with the PWB to form a sandwich.
e. expose the PWB to UV light through the phototool.
f. separate the phototool from the PWB leaving hardened photopolymer on PWB.
g. wash out unexposed paste photopolymer on PWB and post cure if desirable.
h. blot the phototool to remove any photopolymer paste adhering thereto, and reinstituting the cycle.

Step a, phototool preparation is accomplished as previously described.

The PWB is coated, Step b, by screen printing to the desired thickness, normally from 0.5 to 2 thousandths of an inch (0.013 mm to 0.051 mm), as determined by plating bath requirements (temperature, immersion time, plating current density and chemical composition), and the plating thickness to be deposited. The photopolymer thickness is controlled primarily by the screen fabric thickness and percent open area. For example, a 156 mesh polyester fabric will coat the PWB to a thickness of approximately 1 mil, while a 230 mesh fabric will deposit a coating 0.3 mils (0.076 mm) thick.

The phototool is maintained off-contact, but correctly positioned above the coated PWB by the fixturing as shown in FIG. 3. Off contact distance is of the order of 0.060 inches (0.15 cm) for a 12 by 18 inch (0.3 by 0.46 M) PWB.

The phototool is mated with the coated PWB by pressing the blade down at one end of the PWB and drawing the blade across the PWB length, using a downward force of 2 pounds (8.9 N) per linear inch (2.54 cm) of blade length.

Step e, exposure to UV light source, may be accomplished concurrently with the phototool mating Step d. Alternatively, the positioning fixture (with mated phototool) may be exposed to a remote light source. As previously described, the mating process forces out all air from the photopolymer, and all air from between the phototool and photopolymer surface, producing a vacuum. This vacuum is maintained indefinitely, provided the phototool does not start to lift away at the PWB edge in response to the upward pull of the phototool.

Thus, without the use of an external vacuum source, the mated phototool PWB can be exposed to various light sources to effect polymerization. While the preferred embodiment uses tubular mercury vapor lamps to effect exposure in several seconds under the lamps, a flip-top platemaker exposure system of lower power can be used for exposure, but the exposure time increases.

Other suitable lamp sources are the drawer type exposure units such as the COLIGHT DMVL-HP with exposure times of the order of 2 minutes.

The washout of unexposed photopolymer, Step f, is accomplished by using a solvent spray bath lasting from 10 to 30 seconds. The Du Pont "A" Processor with trichlorethane is one combination of equipment and solvent which produced excellent quality images.

Step h, the blotting of the underside of the phototool is required to smooth out unexposed photopolymer which remains on the phototool after the exposed PWB is removed. If left on the phototool, then the next image may be marred by the presence of entrapped air. Usually it is necessary to blot the phototool after every second or third exposure cycle, depending on the photopolymer coating thickness on the PWB.

Blotting is accomplished by use of a rubber roller to obliterate the patterns and distribute the remaining photopolymer more evenly.

Where selected holes are to be tented by the photoimaged resist, the primary difference in the procedures for hole tenting is Step b, in which the phototool is coated rather than the PWB.

Another difference is that blotting the phototool is not necessary when tenting. Since the next step, phototool coating, obliterates the residual photopolymer patterns.

As described earlier, the phototool has a thin layer of clear silicone rubber on the underside. When a coating of photopolymer is applied by screen printing (or other means) onto the silicone rubber, the photopolymer will develop "fish-eyes" or voids which will continue to expand in area with time. This is caused by the inability of the wet photopolymer to grip the silicone rubber, and the photopolymer surface tension causes the photopolymer to form beads, similar to the beading of water on a waxed surface.

In order to prevent the formation of fish-eyes or voids, the disclosed apparatus exposes or flashes the photopolymer through the phototool as the coating is being applied. This flashing step is of sufficient intensity to slightly polymerize the photopolymer over the clear areas of the phototool, but not to the point of exterior surface hardening. That photopolymer above the phototool opaque areas need not be flashed.

It would appear that this flashing step is critical with regard to lamp intensity and exposure time, but in practice it is not. The photopolymers listed in this disclosure, and all photopolymers tested are air-inhibited, meaning that the photopolymer cure with less UV energy in the absence of air than is required in the presence of air. Thus, as the phototool is coated with photopolymer via screen printing, only a thin line of photopolymer immediately under the squeegee is deprived of air, for the screen fabric is off-contact, and touches the phototool only along a line underneath the squeegee. Previously deposited photopolymer, though exposed, will retain a wet surface for good adhesion to the substrate to be printed. This flashing technique is an important aspect of tenting holes in PWB resist imaging, for the flashing ensures a thicker film over the tented hole than would be attained without flashing, for without flashing the photopolymer would thin out at the edges of the holes and would be more likely to break down during washout and immersion in the plating solution.

This flashing step has produced a polymerized image which is hardened on the phototool side, but wet on the exterior side, so that the next step of phototool mating with the substrate can be considered to be an image transfer technique.

DRY FILM PHOTOPOLYMER IMAGING SEQUENCE

The apparatus and procedures disclosed herein can also be used to image PWB using dry film photoimaging resists as manufactured by the Du Pont Company and others. The following Du Pont photopolymers are representative of those which can be mated and exposed as described herein: TYPE 6; 1105; 1010; X1135; 1020 and 310. The procedure shown in the foregoing chart a through f are followed as described for paste-consistency photopolymer, with the exception of the coating cycle, wherein the dry film photopolymer is laminated to the PWB by a heated roller laminator.

Using the disclosed mating and exposing apparatus, the resolution of dry film images can be significantly improved. This increased resolution is achieved by removing the protective polyester sheet which covers the dry film photopolymer prior to exposure. The manufacturer recommends leaving the polyester film in place during exposure and up to the time of development. However, the film, being 0.75 mils (0.019 mm) thick separates the phototool emulsion from the photopolymer surface during exposure and results in loss of image fidelity. When the cover sheet is removed, the unexposed dry film is tacky to the point that a phototool cannot be placed on the photopolymer and moved about to achieve register.

The disclosed apparatus used in accordance with these procedures mates the phototool without air entrapment and exposes the photopolymer without the normal vacuum drawdown period, saving time and improving image fidelity.

MATING AND EXPOSING APPARATUS

In arriving at the preferred embodiment substrates were imaged using three available production equipments modified as described. While these alternates do not provide the capability for coating, mating and exposing as readily as the preferred embodiment, they have high production capacities or other merits.

EXAMPLE NO. 1

A substrate can be coated via screen printing, placed in the exposure fixture and imaged with a modified conveyorized UV curing unit, consisting of horizontal tubular UV lamps with a conveyor belt for moving substrates under the lamps. These UV curing units can be used for producing images per this disclosure by the addition of a mating blade assembly and phototool coolant-dispensing apparatus as shown in FIG. 4.

Conveyor belt 36 conveys the phototool assembly 42 under blade 10. Blade 10 is pulled downward by vacuum cylinders 40, for a period of time beginning when the leading edge of metal strip on the bottomside of phototool assembly 42 bridges electrical contacts mounted under conveyor belt 36. The conveyor belt on most UV curing units are made of fiberglass mesh encased in a heat resistant plastic enabling the filaments comprising the electrical contacts to extend thru the mesh and contact the blade control strip. This action permits precise control of the blade and prevents the blade from striking the leading or trailing edge of the phototool frame.

Co-mounted with blade 10 is reservoir 15 containing the phototool coolant which is dispensed by a sponge not shown in FIG. 4.

UV curing unit 37 is a standard 2 lamp system manufactured for example by Argus Manufacturing Inc. of Hopewell, N.J. or COLIGHT INC. of Minneapolis, Minn., modified to accommodate blade 10, blade activator vacuum cylinder 40, and blade activator switch previously described. Lamps 41 expose the photopolymer.

The use of a modified UV-curing unit as an exposure source has two attributes not afforded by the preferred embodiment. First, the use of a modified UV curing unit permits a much higher rate of production, for many different types of images can be exposed sequentially with no UV curing unit changes. This allows a large production facility to coat PWB on multiple screen printers and to expose with a single high speed curing unit.

The second attribute of the use of UV curing unit is that substrates of exceptional length can be mated and exposed, obviating the need for oversize cabinetry.

EXAMPLE NO. 2

The second alternative apparatus is the use of an automatic screen printer with modifications including the addition of a tubular lamp integrally mounted with the print bar assembly; a power supply; and coolant dispensing apparatus. Precision automatic printers, such as made by Autoroll, can maintain the required registration without the need for fixturing as shown in FIG. 3. The automatic printers can be used in two ways; with and without positioning fixture 42. When used without the positioning fixture, the coated substrates are mated and exposed, with registration being maintained by the printer.

When used with the positioning fixture then a single printer can mate and expose different types of intermixed PWB for high speed production.

EXAMPLE NO. 3

The third alternative apparatus which can be used for exposure of mated substrates is the use of a platemaker, such as the units made by NUARC of Chicago, Ill. The nonstop platemaker has a cabinet-mounted lamp and a swivel top which allows one substrate to be exposed while a second substrate is being prepared on the top surface. When used as an exposure source for imaging as disclosed herein, an exposure fixture as in FIG. 3 is mounted on each side of the flip-top; one exposure fixture for each side of a double sided PWB, for example. The substrates are coated on auxiliary equipment and mated manually. This alternative apparatus represents the least expensive method for imaging per this disclosure in a manual environment.

Having therefore set out the construction and operation of a preferred embodiment of the invention and advanced the state of the art, these features of novelty believed descriptive of the spirit and nature of the invention are set forth with particularity in the appended claims.

INDUSTRIAL APPLICATION

There is provided an improved process and apparatus for making precision photo images particularly useful in the production of printed wiring circuits, where a resist image is put on a copper-clad board to limit the plated metal to those areas which will become electrical conductors.

Thus, a UV curable photopolymer of paste-consistency is applied over the board surface and selectively exposed through a phototool in contact with the wet photopolymer, producing a hardened resist pattern which withstands the subsequent solvent wash-out step.

Additionally, the disclosed process and apparatus provides an improvement in half-tone dot printing, particularly for substrates heretofore imaged by screen printing.

I claim:
1. A process for contacting two air-impermeable sheets, one having a photo image thereon, in a sandwich with a photopolymer layer therebetween comprising the steps of,
   coating one said sheet with said photopolymer,
   placing one said sheet on a smooth surface,
   disposing the second sheet adjacent to and spaced slightly from the first sheet with the coating therebetween,
   scanning a resilient member along the second sheet to force the sheets into contact to remove air and smooth the coating into a coating of uniform thickness,
   scanning a light source to follow said resilient member and thereby expose and harden the photopolymer in a pattern produced by said photo image, and
   disposing a liquid coolant on the upper surface of the second sheet during scanning in a position between the blade and the light source.

2. A process of producing printed graphic images using photopolymers, comprising the steps of,
   providing two sheets, at least one being flexible and one having a photo image on one surface thereof,
   disposing a first of said sheets on a flat surface,
   depositing on said first of said film sheets a photoactive coating of unexposed photopolymer,
   superimposing on said coating a flexible said sheet to establish a sandwich with the photopolymer coating therebetween with the photo image disposed adjacent to the photopolymer coating,
   scanning across the superimposed flexible sheet with a resilient member to establish between the two sheets an unexposed photopolymer coating of uniform thickness with air removed from between the sheets.

3. The process defined by claim 2 including the step of coating the surface of a flexible said sheet with a silicone rubber adhesive so that hardened photopolymer will not adhere thereto.

4. The process defined in claim 2 including the step of producing a said graphic image by exposing the photopolymer on the first of said sheets during said scanning step.

5. The process defined in claim 2 comprising the further steps of scanning a light source across the flexible photo image carrying sheet to follow said resilient member and thereby expose and harden the photopolymer in a pattern produced by said photo image thereby to provide in a single scan simultaneous lamination of the two sheets together and exposure of a said graphic image.

6. The process defined in claim 5 comprising the further step of removing the flexible photo image carrying sheet to leave the photopolymer on the other sheet and removing unhardened photopolymer by dissolving it.

7. The process defined in claim 5 including the steps of keeping the image separated by an air film from the photopolymer ahead of said scanning member and making contact between the image bearing flexible sheet and the photopolymer coating as the scanning member contacts the outer surface of the image carrying flexible sheet, and pre-exposure flashing of the polymer through the image as the coating is being applied thereby causing a portion of the photopolymer surface exposed to air to be partly pre-exposed.

8. The process defined in claim 2, wherein the step of disposing the first sheet on said flat surface comprises using said first of the sheets as a layer clad to a support member forming said flat surface.

9. The process defined in claim 8, wherein the first sheet clad on said flat surface is a copper layer surface of a printed wiring board.

10. The process defined by claim 2 including the step of positioning said sheet with a photo image on said flat surface to be coated with photopolymer.

11. The process defined by claim 10 including the step of photoflashing the coating through the flexible sheet only sufficiently to harden the photopolymer coating adjacent the flexible sheet.

* * * * *